(12) United States Patent
Parrish et al.

(10) Patent No.: US 6,550,665 B1
(45) Date of Patent: Apr. 22, 2003

(54) METHOD FOR ELECTRICALLY INTERCONNECTING LARGE CONTACT ARRAYS USING EUTECTIC ALLOY BUMPING

(75) Inventors: William J. Parrish, Santa Barbara, CA (US); Jeffrey B. Barton, Goleta, CA (US)

(73) Assignee: Indigo Systems Corporation, Goleta, CA (US)

( * ) Notice: Subject to any disclaimer, the term of this patent is extended or adjusted under 35 U.S.C. 154(b) by 0 days.

(21) Appl. No.: 09/876,780

(22) Filed: Jun. 6, 2001

(51) Int. Cl.[7] .............................................. B23K 31/02
(52) U.S. Cl. ........................... 228/180.22; 228/180.21; 228/245; 257/738
(58) Field of Search ................ 228/180.22, 180.21, 228/245, 246; 438/613; 257/737, 738

(56) References Cited

U.S. PATENT DOCUMENTS

| | | | | |
|---|---|---|---|---|
| 4,875,617 A | | 10/1989 | Citowsky ..................... 228/123 |
| 4,930,001 A | | 5/1990 | Williams ..................... 357/71 |
| 5,017,738 A | * | 5/1991 | Tsuji et al. ................ 174/94 R |
| 5,186,379 A | | 2/1993 | Helber, Jr. .................. 228/116 |
| 5,264,699 A | * | 11/1993 | Barton et al. ............. 250/338.4 |
| 5,308,980 A | | 5/1994 | Barton ..................... 250/338.4 |
| 5,468,655 A | * | 11/1995 | Greer ............................. 437/8 |
| 5,611,481 A | * | 3/1997 | Akamatsu et al. ...... 228/180.22 |
| 5,646,426 A | | 7/1997 | Cockrum et al. ............ 257/188 |
| 5,814,891 A | * | 9/1998 | Hirano ......................... 257/778 |
| 5,897,341 A | | 4/1999 | Love et al. .................. 438/125 |
| 5,902,686 A | * | 5/1999 | Mis ............................. 428/629 |
| 6,329,608 B1 | * | 12/2001 | Rinne et al. ................. 174/261 |
| 6,340,113 B1 | * | 1/2002 | Avery et al. .............. 228/248.5 |

* cited by examiner

Primary Examiner—M. Alexandra Elve
Assistant Examiner—Len Tran
(74) Attorney, Agent, or Firm—MacPherson Kwok Chen & Heid LLP

(57) ABSTRACT

Methods of forming arrays of electrical interconnects between substrates are provided. These methods allow the use of large interconnect bump arrays to physically and electrically connect substrates without the need to use excess pressure on the substrates to form the interconnects, thus reducing damage to the substrates. To form the interconnects, an array of bumps is formed on a first substrate from a material that forms a eutectic composition with a second material. An array of bumps composed of the second material is formed on the second substrate. The arrays are aligned and the bumps contacted at a temperature above the eutectic temperature of the eutectic composition. Each of the bumps on the first substrate melts and diffuses into the corresponding bumps on the second substrate to form the interconnects.

28 Claims, 8 Drawing Sheets

METHOD FOR ELECTRICALLY INTERCONNECTING LARGE CONTACT ARRAYS USING EUTECTIC ALLOY BUMPING

BACKGROUND OF THE INVENTION

1. Field of the Invention

The present invention relates to a method of forming arrays of electrical interconnects between substrates. In particular, the present invention relates to a method of using a eutectic composition to form physical and electrical interconnects.

2. Description of the Background

In the fabrication of certain types of semiconductor devices it is desirable to mate one semiconductor device to another. The mated semiconductor devices may be of the same material or different materials, and are mated to physically attach the devices to each other. Additionally it may be desired to form a large number of electrical interconnects between the devices to allow electrical conduction of signals from one device to the other. An example of the use of this type of interconnect technology is in the area of modern state-of-the-art infrared components. In these devices one material is optimized to perform the detection function while another material is optimized to perform the function of detector biasing, signal integration, signal processing, and multiplexing. The interconnect arrays for these devices physically and electrically interconnect the infrared detector to the readout-integrated-circuit. For these devices it is desirable to form from one to millions of electrical interconnects between these materials.

Implementations of high-density indium bump interconnect technologies are described in, for example, U.S. Pat. No. 4,930,001 to Williams et al. and U.S. Pat. No. 5,186,379 to Helber et al. In these methods, the electronic interconnects are formed by first forming metallic bumps or pads on each substrate to be electrically connected, and then precisely aligning the device substrates and their respective interconnect bump arrays to one another. The bumps are then attached to each other using elevated temperatures to melt the bumps into each other, or elevated pressures to force solid bumps to bond in a process known as a "cold weld," or by using a combination of elevated temperature and pressure. For example, U.S. Pat. No. 5,186,379 describes a cold weld method of forming of an intermetallic-free alloy between indium and a second metal such as aluminum, cadmium, gallium, germanium, silicon, or zinc in which pressures between 2000 and 6000 PSI are used to bond the bumps. A combination of elevated temperature and pressure has been used to bond indium bumps to gold pads, as described in U.S. Pat. No. 4,930,001. The indium bumps are pressed into the gold pads at a high pressure (800 PSI) for a short period of time to temporarily fuse the bumps. The fused bumps are then heated to an elevated temperature (100° C.) to melt and weld the indium and gold.

There are a number of problems with these and other methods used to electrically interconnect devices with bump bonding. In particular, for arrays containing a large number of interconnect bumps, it is necessary to use high pressures to cause the bumps to bond. Because the force required to mate and bond two arrays of bumps increases linearly with the number of bumps, as the bump density increases (or the area of the device increases for a given bump density), the force that must be used to form bonds between the devices must be increased. The increased force may exceed the strength of the materials to be mated and damage those materials and devices contained within them, reducing process yields and degrading the reliability of the devices.

High temperatures used for molten solder processes allow the bump contact to be made at very low pressures. However, the devices must be maintained at a very precise alignment during the thermal exposure cycle to prevent the bumps from cross-wetting the adjacent bumps. Additionally, if the mating substrate materials have dissimilar coefficients of thermal expansion, stresses introduced into the mating bumps as the device cools can also lead to substrate damage and device failure.

SUMMARY

A method is provided that allows for the use of large arrays of interconnects to physically and electrically mate two substrates without the need to use excessive pressure on the substrates, thus advantageously reducing the damage to substrates and improving yields. In one embodiment, an array of bumps is formed on a first substrate. The bumps are formed from a material that forms a eutectic composition with a second material. An array of bumps made from the second material is formed on a second substrate. The arrays of bumps on the first and second substrates are aligned and brought into contact with each other at a contact temperature, which is a temperature above the eutectic temperature of the eutectic composition formed by the two materials and typically below the melting temperatures of the two materials. The contacted bumps join to form joined bumps. The relative volumes of the bumps on the first substrate to the bumps on the second substrate can be used to control the phase of the joined bumps at the contact temperature. The substrates and joined bumps may then be cooled to below the eutectic temperature. An adhesive material may also be applied to interstices between joined bumps after mating and joining the bumps to provide additional mechanical support.

In one embodiment, a portion of the array of bumps on the first substrate is made of a different material than the first material. This portion of the array of bumps may be at the periphery of the array, and may be used, for example, to add structural support to the resulting array of electrical interconnects. In one embodiment, this portion of the array of bumps is made from indium and the rest of the bumps on the first substrate are formed from gallium. The array of bumps on the second substrate is also formed from indium.

In one embodiment, one of the substrates is an IR sensitive detector material and the other substrate is an integrated circuit readout chip and the method is used to form an infrared sensor device.

DETAILED DESCRIPTION

Figure 1:
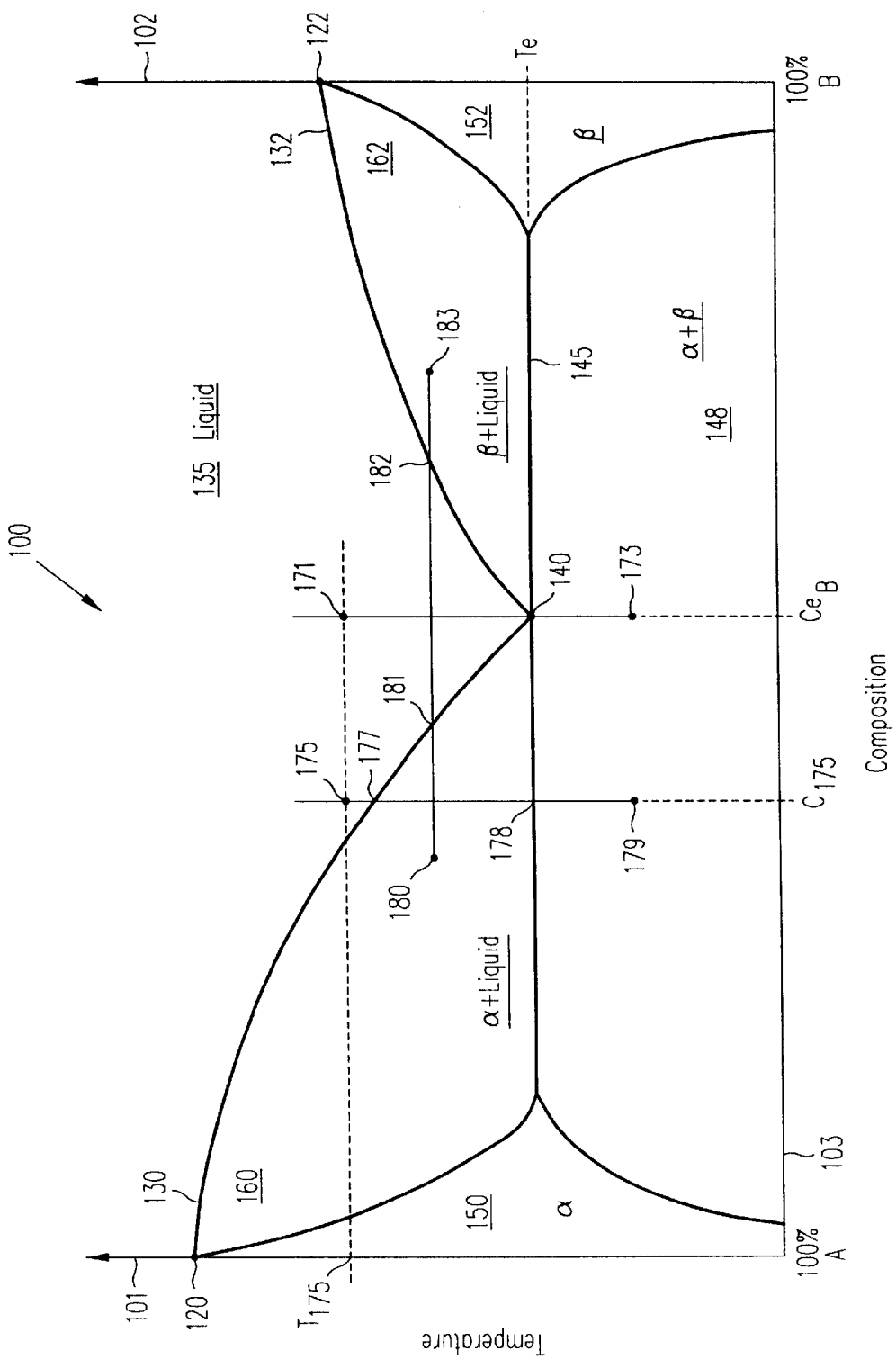
FIG. 1 is a binary phase diagram for two materials, A and B, that form a eutectic alloy.

FIG. 1 illustrates the well-known binary phase diagram 100 for two materials, A and B, which form a eutectic composition or alloy. The diagram shows the phase of mixtures of A and B as a function of temperature (vertical axes 101 and 102, respectively) and composition (horizontal axis 103). The units of composition are, for example, weight % B. The melting temperature of each of the pure materials A and B is indicated at points 120 and 122, respectively, on the corresponding vertical axes 101 and 102. Lines 130 and 132 descending from the melting temperatures 120 and 122 are referred to as the liquidus lines. At temperatures and compositions that are in region 135, above the liquidus lines 130, 132, the mixture of materials A and B is a liquid.

The liquidus lines 130, 132 meet at a point 140 referred to as the eutectic point. Eutectic point 140 occurs at the eutectic temperature, Te, and eutectic composition Ce. Below the eutectic temperature, indicated by line 145, all compositions of the mixture of A and B are solid ("α" indicates a solid of almost entirely pure material A and some B, "β" indicates a solid of almost entirely pure material B with some A). Regions 150 and 152, in which the composition is almost entirely pure A or B, respectively, are also entirely solid α or β.

For regions 160 and 162 of diagram 100, between the eutectic temperature line 145 and the liquidus lines 130 and 132, respectively, the mixture is partially solid and partially liquid. In region 160, where the composition is predominantly A, the solid is pure grains of α. Similarly, in region 162 the solid is pure grains of β.

For a mixture of A and B having a given composition, changing the temperature changes the phase of the mixture. For example, point 175 indicates a mixture that has a composition $C_{175}$ and that is at a temperature $T_{175}$. Composition $C1_{175}$, which is not at the eutectic composition, is referred to as a hypoeutectic alloy. At temperature $T_{175}$, composition $C_{175}$ is a liquid mixture of A and B. Upon cooling, grains of pure solid α begin to form in the liquid at the temperature indicated by point 177. As the $C_{175}$ mixture is slowly cooled, more liquid A becomes solid α, and A is depleted from the liquid phase. The liquid becomes enriched in molten B, until the eutectic temperature Te is reached at point 178. At the eutectic temperature the remaining liquid forms a solid of the eutectic composition, which typically has a lamellar microstructure with alternating layers of α and β within each grain (individual crystal) of the solid. At point 179, solid grains of pure α are embedded in solid lamellar grains of the eutectic mixture of α and β. Note that as a mixture that has the eutectic composition, Ce, is slowly cooled from, e.g., point 171 to 173, the phase of the mixture will change directly from a liquid to a solid, which is composed of solid lamellar grains of the eutectic mixture, at the eutectic point 140.

Phase diagram 100 also shows that, for a given temperature, changing the composition of a mixture of A and B can also change the phase of the mixture. This can be seen, for example, from the line between points 180 and 183. If more B is added to a mixture having the temperature and composition of point 180, solid α in the mixture will dissolve into the liquid until the composition reaches the composition of point 181, in which all solid has dissolved. At compositions between point 181 and point 182, the mixture is liquid. At point 182, solid β begins to form in the liquid, and continues to form as more B is added.

The embodiments of the present invention take advantage of these properties of eutectic and hypoeutectic compositions to form interconnects between semiconductor or other devices without the use of excess pressure on the substrates to form the interconnects. If, at a temperature, such as $T_{175}$, which is above the eutectic temperature but not necessarily above the melting temperatures of A and B, an array of bumps of material A and an array of bumps of material B are placed so that the bumps contact each other, the two materials will diffuse and melt into each other without the application of additional force to the bumps. Materials A and B that form the eutectic or hypoeutectic composition are chosen to be electrically conductive, so that the fused bumps form an electrical interconnection. Because no, or little, force is used in forming the electrical interconnects, the method allows substrates that would otherwise be damaged by the use of force to be electrically connected, and also allows substantially larger and denser arrays of bumps to be used to connect the substrates.

Figure 2A:
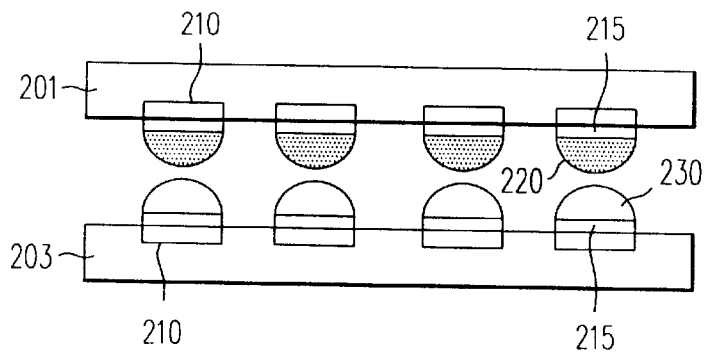
FIG. 2A is a cross-sectional side view of two substrates, each having an array of bumps that are aligned.

An exemplary method for forming such interconnects between two substrates is illustrated in FIGS. 2A–2D. In FIG. 2A, two substrates, 201 and 203 are to be electrically connected. Substrates 201 and 203 may be any two substrates that are to be physically and electrically connected and may be, for instance, semiconductor chips made from, e.g., silicon or germanium, circuit boards made from, e.g., ceramics or metalized ceramics, or IR sensitive detectors made from, e.g., InSb, HgCdTe, CdTe, InGaAs, ceramics, or glasses. Substrates 201, 203 may contain an array of electrically conductive contact pads 210. These contact pads 210 are typically made from suitable metals, such as aluminum, and are formed on the substrates 201, 203 by methods known by those of skill in the art. Pads 210 may have a layer or layers of additional metals (or other conductive material) 215, such as a chromium or titanium adhesion layers, and nickel or nitride diffusion barriers, as described in U.S. Pat. No. 5,646,426, incorporated herein by reference in its entirety. Layers 215 can serve to adhere the bumps 220, 230 to contact pads 210 and thus bumps 220, 230 are attached to the substrates 201, 203.

An array of bumps 220 of, e.g., material A (which forms a eutectic composition with material B) are formed on a surface of the first substrate 201 and an array of bumps 230 made from, e.g., material B are formed on a surface of the second substrate 203. Materials A and B used to form bumps 220, 230 may be any materials that form an electrically conductive eutectic alloy, for example indium and gallium or indium with tin, cadmium or bismuth, as well as bismuth and lead or bismuth and tin. In addition to binary eutectic alloys, eutectic alloys of three or more elements may also be used, for example, the ternary eutectic alloy formed from indium, bismuth and tin. Examples of metals that can be used to form bumps 220, 230 are listed in Table 1, along with the composition of the metals that form the eutectic alloy.

TABLE 1

| Melting Point ° C. | Composition, wt % | | | | |
|---|---|---|---|---|---|
| −48 | Cs | K | | | |
|  | 77.0 | 23.0 | | | |
| −40 | Cs | Rb | | | |
|  | 87.0 | 13.0 | | | |
| −30 | Cs | Na | | | |
|  | 95.0 | 5.0 | | | |
| −11 | K | Na | | | |
|  | 78.0 | 22.0 | | | |
| −8 | Rb | Na | | | |
|  | 92.0 | 8.0 | | | |
| 10.7 | Ga | In | Sn | | |
|  | 62.5 | 21.5 | 16.0 | | |
| 10.8 | Ga | In | Sn | | |
|  | 69.8 | 17.6 | 12.5 | | |
| 17 | Ga | Sn | Zn | | |
|  | 82.0 | 12.0 | 6.0 | | |
| 33 | Rb | K | | | |
|  | 68.0 | 32.0 | | | |
| 46.5 | Sn | Bi | Pb | In | Cd |
|  | 10.65 | 40.63 | 22.11 | 18.1 | 8.2 |
| 47 | Bi | Pb | Sn | Cd | In |
|  | 44.7 | 22.6 | 8.3 | 5.3 | 19.1 |
| 58.2 | Bi | Pb | Sn | In | |
|  | 49.5 | 17.6 | 11.6 | 21.3 | |
| 60.5 | In | Bi | Sn | | |
|  | 51.0 | 32.5 | 16.5 | | |
| 70 | Bi | Pb | Sn | Cd | |
|  | 50.0 | 25.0 | 12.5 | 12.5 | |
| 70 | Bi | Pb | Sn | Cd | |
|  | 50.0 | 26.7 | 13.3 | 10.0 | |
| 70 | In | Bi | | | |
|  | 67.0 | 33.0 | | | |
| 91.5 | Bi | Pb | Cd | | |
|  | 51.6 | 40.2 | 8.2 | | |
| 95 | Bi | Pb | Sn | | |
|  | 52.5 | 32.0 | 15.5 | | |
| 97 | Bi | Sn | Pb | | |
|  | 50.0 | 18.8 | 31.2 | | |
| 98 | Bi | Sn | Pb | | |
|  | 50.0 | 25.0 | 25.0 | | |
| 100 | Bi | Sn | Pb | | |
|  | 50.0 | 20.0 | 30.0 | | |
| 102.5 | Bi | Sn | Cd | | |
|  | 54.0 | 26.0 | 20.0 | | |
| 109 | Bi | Pb | Sn | | |
|  | 50.0 | 28.0 | 22.0 | | |
| 117 | In | Sn | | | |
|  | 52.0 | 48.0 | | | |
| 120 | In | Cd | | | |
|  | 75.0 | 25.0 | | | |
| 123 | Bi | Sn | Pb | | |
|  | 46.1 | 34.2 | 19.7 | | |
| 124 | Bi | Pb | | | |
|  | 55.5 | 44.5 | | | |
| 130 | Bi | Sb | Zn | | |
|  | 56.0 | 40.0 | 4.0 | | |
| 140 | Bi | Sn | | | |
|  | 58.0 | 42.0 | | | |
| 140 | Bi | Cd | | | |
|  | 60.0 | 40.0 | | | |
| 183 | Sn | Pb | | | |
|  | 63.0 | 37.0 | | | |
| 185 | Tl | Bi | | | |
|  | 52.0 | 48.0 | | | |
| 192 | Sn | Pb | | | |
|  | 70.0 | 30.0 | | | |
| 198 | Sn | Zn | | | |
|  | 91.0 | 9.0 | | | |
| 199 | Sn | Zn | | | |
|  | 92.0 | 8.0 | | | |

TABLE 1-continued

| Melting Point ° C. | Composition, wt % | | | |
|---|---|---|---|---|
| 199 | Sn | Sb | | |
|  | 92.0 | 8.0 | | |
| 221 | Sn | Ag | | |
|  | 96.5 | 3.5 | | |
| 226 | Bi | Pb | Sn | Sb |
|  | 48.0 | 28.5 | 14.5 | 9.0 |
| 227 | Sn | Cu | | |
|  | 99.25 | 0.75 | | |
| 240 | Sn | Sb | | |
|  | 95.0 | 5.0 | | |
| 245 | Sn | Ag | | |
|  | 95.0 | 5.0 | | |

Bumps 220, 230 are typically formed on the pads 210 or metal layers 215, if present on subtrate 203. Bumps 220, 230 may also be formed directly onto the substrate 201, 203, which may be done to provide mechanical support between the substrates without necessarily forming electrical contacts. The method of forming the bumps 220, 230 will depend on the material used, but bumps 220, 230 are typically formed by conventional deposition techniques such as sputtering, ion plating, evaporation, electrodeposition, and electroless deposition. The materials A and B are deposited through a mask having openings with, e.g., the same pattern as the pads 210, to form the bumps 220, 230. The number and density of bumps in the array will depend on the materials used and the application. Using the method described herein, the size of the array is not limited by the interconnect formation process because it is not necessary to use additional force on the substrates to form interconnects.

As shown in FIG. 2A, the substrates 201, 203 are precisely aligned so that each of the bumps 220 on substrate 201 is aligned with the corresponding bumps 230 on substrate 203. A hybridization apparatus, which may be used to contact the bumps 220, is typically also used for precisely aligning the bumps 220, 230 using methods that are known in the art.

Figure 2B:
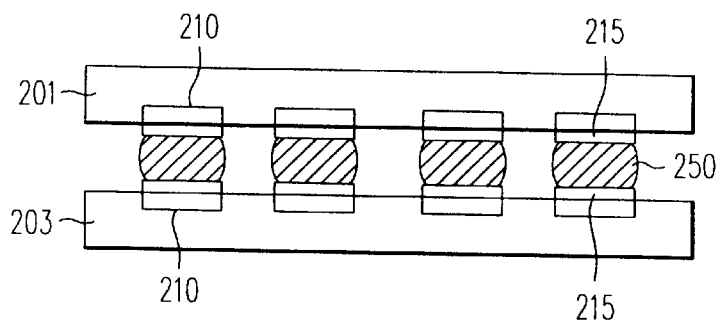
FIG. 2B is a cross-sectional side view of the substrates of FIG. 2A with the two arrays of bumps joined.

The substrate and bumps are brought to a temperature, referred to herein as the contact temperature, which is above the eutectic temperature of the eutectic alloy formed by the mixture of A and B and is typically also below the melting temperatures of the bump material A and material B. At this contact temperature, material A in bumps 220 will diffuse and melt into material B in bump 230 and vice versa. The substrates 201, 203 and bumps 220, 230 may be brought to the contact temperature either before or after the alignment procedure, or after the corresponding bumps of the arrays are brought into contact with each other, as illustrated in FIG. 2B. Achieving a desired contact temperature may be accomplished within the hybridization apparatus using, for example, temperature controlled stages on which the substrates 201, 203 are placed.

Once the substrates 201, 203 and bumps 220, 230 are aligned, the corresponding bumps of the arrays are brought into contact with each other, as illustrated in FIG. 2B. When in contact and at the contact temperature, bumps 220, 230 of FIG. 2A will diffuse into each other to form joined bumps 250. In some instances, once the bumps 220, 230 are in contact, it may be desirable to increase the temperature of the contacted substrates 201, 203 to above the chosen contact temperature, or even to above the melting temperature of one or both of the materials A and B, to increase the rate of diffusion of the materials A and B into each other. The bumps 220, 230 typically diffuse into each other without the use of added force onto the substrates. The phase of joined bump 250 may be liquid or a mixture of liquid and solid, depending on the initial masses of bumps 220, 230, (and composition of joined bump 250) as described below.

Figure 2C:
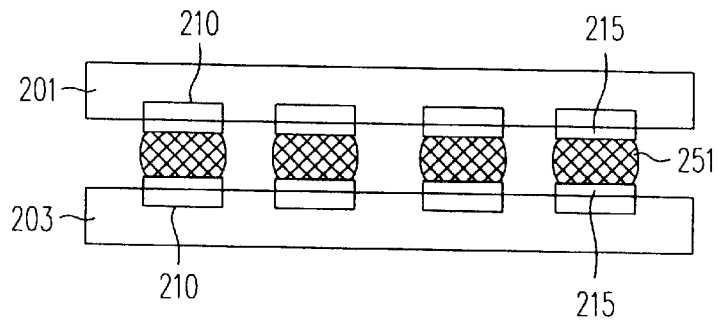
FIG. 2C is a cross-sectional side view of the substrates and joined bumps of FIG. 2B cooled to form solid interconnects.

The substrates 201, 203 and joined bumps 250 may then be cooled to a temperature below the eutectic temperature so that the joined bump 250 forms a solid interconnect 251, as illustrated in FIG. 2C. It may be advantageous to use a rate of cooling that is slow enough so that the composition of the liquid of joined bump 250 is retained in the solid of interconnect 251, allowing crystals of eutectic composition to form. Slow cooling keeps the phase of the joined bump 250 liquid as long as possible, which helps to reduce residual stresses between substrates 201, 203. The rate of cooling will depend on the materials A and B used to form the interconnect 251, but, for example, may be in the range of from 0.1 second to 1.0 minute per degree for bumps 220, 230 of indium and gallium, respectively.

Figure 2D:
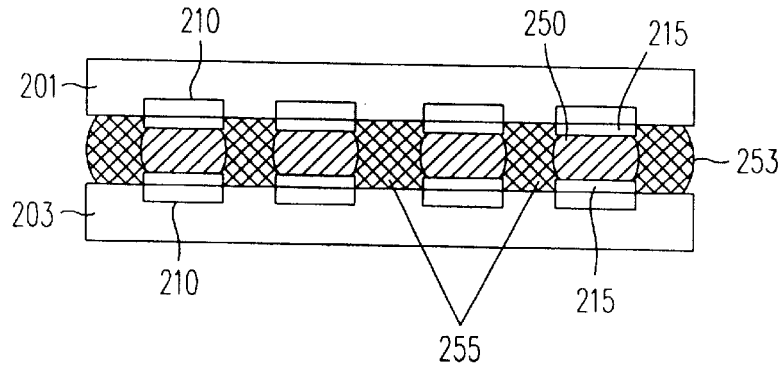
FIG. 2D is a cross-sectional side view of the substrates and joined bumps of FIG. 2B with an adhesion material between the joined bumps.

As illustrated in FIG. 2D, an epoxy or other adhesive material 253, may be wicked into the interstices 255 between the joined bumps 250. The epoxy 253 can then serve to mechanically stabilize and physically connect the substrates 201, 203. The joined bumps 250 may remain in the liquid or mixed liquid and solid phase to provide electrical connection between the substrates 201, 203. Alternatively, the joined bumps 250 may be cooled to below the eutectic temperature to become solid phase and provide additional physical support besides that provided by the adhesive material as well as electrical connection.

Figure 3:
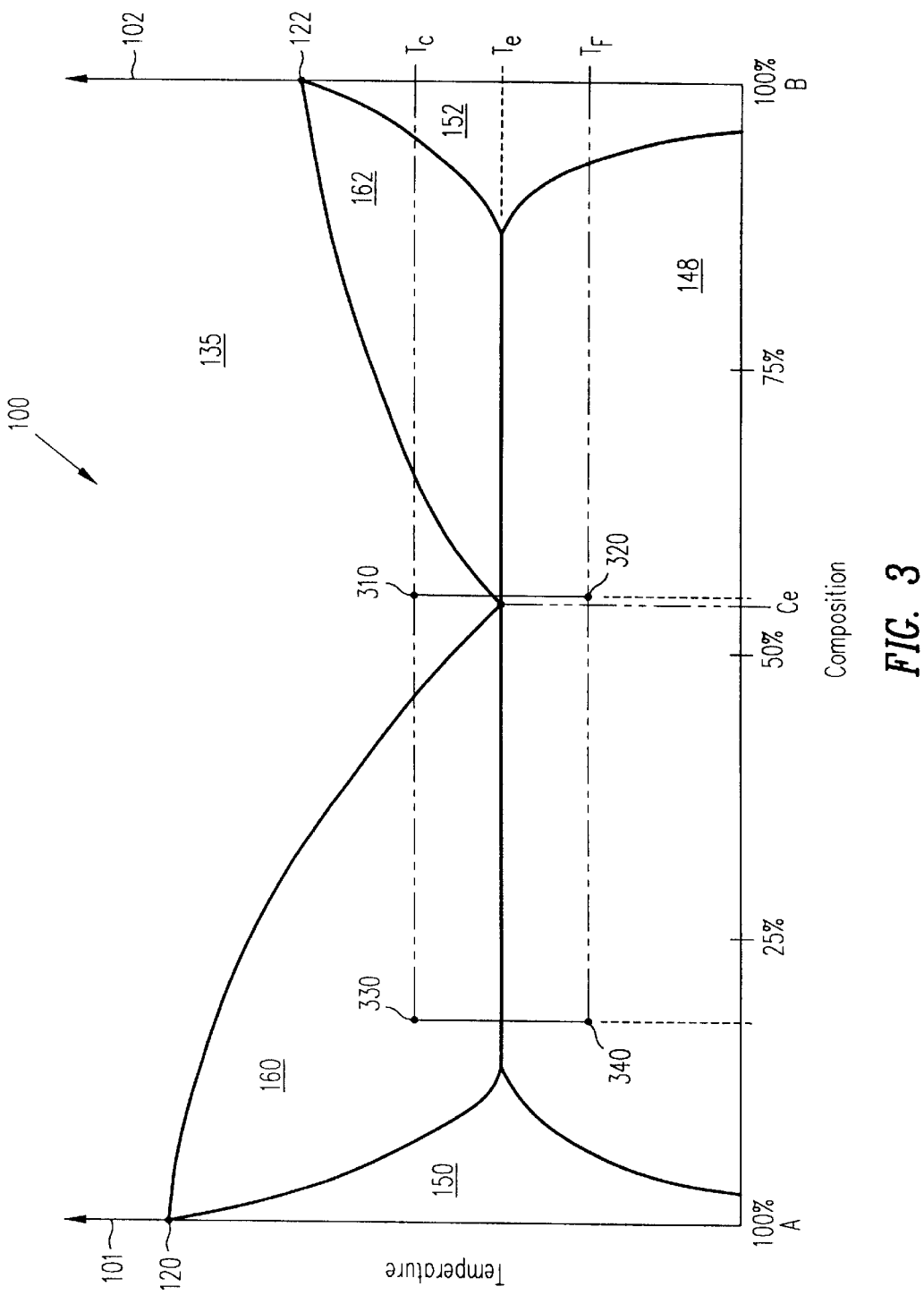
FIG. 3 is the binary phase diagram for two materials, A and B, that form a eutectic alloy as illustrated in FIG. 1, showing the phase as a function of temperature for two different compositions of joined bumps.

The bumps 220, 230 will form a mixture having a composition, and hence phase at the contact temperature, that depends on the initial masses and compositions of each of the two bumps. For example, bump 220 may be formed of pure material A (which forms a eutectic alloy with material B having the phase diagram 100 of FIG. 3) and have a mass that is 45% the final mass of the joined bumps 250. Bump 230 would thus have a mass that is 55% of the joined bump 250 and the composition of joined bump 250 would be close to the eutectic composition Ce (FIG. 3). At a contact temperature of, for example, $T_c$ the bumps 220, 230 will melt into each other and the phase of the joined bumps 250 will be completely liquid, as shown by point 310 on FIG. 3. A potential advantage of liquid phase joined bumps 250 is that as the bumps 220, 230 melt into each other, the surface tension of the liquid may cause the substrates to further align. Because the composition of the joined bumps 250 are at or close to the eutectic composition, if the joined bumps 250 are then slowly cooled to below the eutectic temperature Te, for example to temperature $T_F$, the liquid will transition almost directly into a solid of eutectic composition at point 320. The lamellar microstructure of such a solid may have advantageous strength and reliability properties.

Alternatively, bumps 220 made of pure material A may have a significantly larger mass than mating bumps 230 of pure material B. For example, bump 220 may have a mass that is 85% of the total mass of joined bumps 251 (and thus bump 230 of material B has a mass that is 15% of the mass of joined bump 251). Thus, when combined, material A dominates the composition. Under these conditions, the initial contact of the materials results in a combined liquid and solid at the contact interface and bump 230 of material B, which has the lesser mass of material, is consumed into bump 220. In effect, after bump a 230 with the lesser mass diffuses into the larger mass of bump 220, the composition is almost entirely solid, as shown, for example, in FIG. 3 at point 330. Depending on the materials used and substrates to be joined, it may be desirable for joined bump 250 to remain almost entirely solid phase. A liquid phase joined bump 250 may not be able to support the substrates, which may collapse and cause the joined bumps of the array to mix with each other. In the solid phase, joined bump 250 may provide more structural support to the substrates and prevent these potential problems. Note that the relative masses of bumps 220, 230 may also be adjusted so that material B dominates the composition of joined bump 250.

The joined bump 250 having a substantially solid phase may then be cooled to below the eutectic temperature, as illustrated by point 340. The joined bump 250 will become entirely solid and have a microstructure that is almost entirely grains of β with some solid lamellar grains of the eutectic mixture.

Other combinations of bump size and bump composition may be used. For example, bumps 220, 230 do not need to be formed from pure materials A and B, but may be made from mixtures of A and B of various compositions. Bumps 220, 230 may also contain additional materials, in particular if a eutectic alloy formed from three or more materials is used. For example, if a ternary eutectic alloy is used, bumps 220 may be formed from two of the three materials and bump 230 may be formed of the other material, in the appropriate ratios to achieve the desired properties in the joined bump 250.

Portions of the array of bumps 220, 230 on each substrate 201, 203 may also contain bumps made of a different material than the rest of the array, so the resulting interconnects 251 are formed from more than one material or composition of materials. Forming interconnects 251 from more than one material may be useful in the case where a first set of bumps and hence first set of interconnects in the array can be formed without the use of additional pressure to the substrates, but have reduced mechanical strength that may cause problems in the formation of the interconnects. In this instance additional interconnects may be made by a second set of bumps in the array. The second set of bumps may be made from a material that, if used for the entire array, would require the use of more pressure to form the interconnects than the substrate can withstand without being damaged. However, the second set of bumps can be used in a smaller number to add structural support to the connection without requiring the use of this excess pressure to form the connection. This embodiment is illustrated below for the example of an IR detector array mated to an integrated circuit readout chip, which forms an IR sensor device such as those described in U.S. Pat. No. 5,308,980 to Barton and U.S. Pat. No. 5,264,699 to Barton et al., incorporated herein by reference. However, the method may be applied to any two substrates to be physically and electrically connected.

Figure 4A:
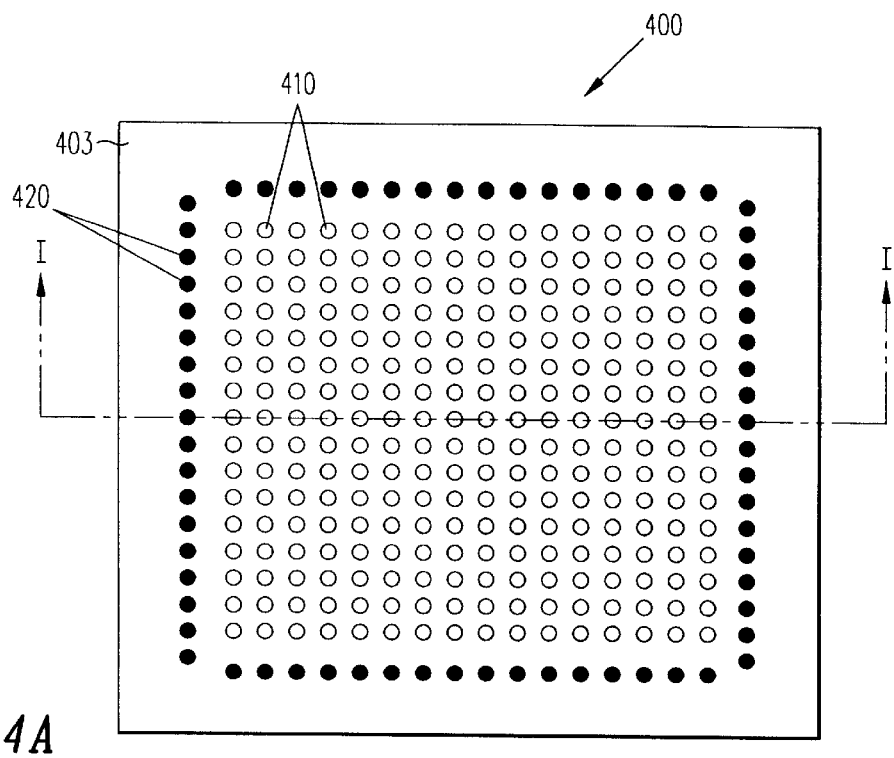
FIG. 4A is a plan view of an integrated circuit readout chip having an array of core bumps and periphery bumps formed on a surface of the readout chip.

FIG. 4A illustrates a surface 403 of an integrated circuit readout chip 400 having bumps 410, 420 formed thereon. In the center of the surface 403, a 16×16 array of bumps 410, referred to herein as core bumps 410, are formed of Ga. Lines of 18 In bumps 420 are formed at each edge of the surface 403, so that the bumps 420, referred to herein as periphery bumps 420, surround the core bumps 410. Methods used to form the bumps 410, 420 are described below in reference to FIGS. 7A–7F. Typically, readout chip 400 is part of a larger wafer (not shown) containing many readout chips 400, and the pattern of core 410 and periphery 420 bumps is deposited on each readout chip 400 of the wafer. Individual readout chips 400 are then cut from the wafer. The number of bumps in the array of core 410 and periphery 420 bumps illustrated in FIG. 4A is exemplary, is typically much larger, and generally depends on the size of and distance between the pixels in the IR detector die 450. For instance, typical array sizes for the readout chip 400 are, for example, 320×256 bumps for a 30 micron pitch or 640×512 bumps for a 25 micron pitch.

Figure 4B:
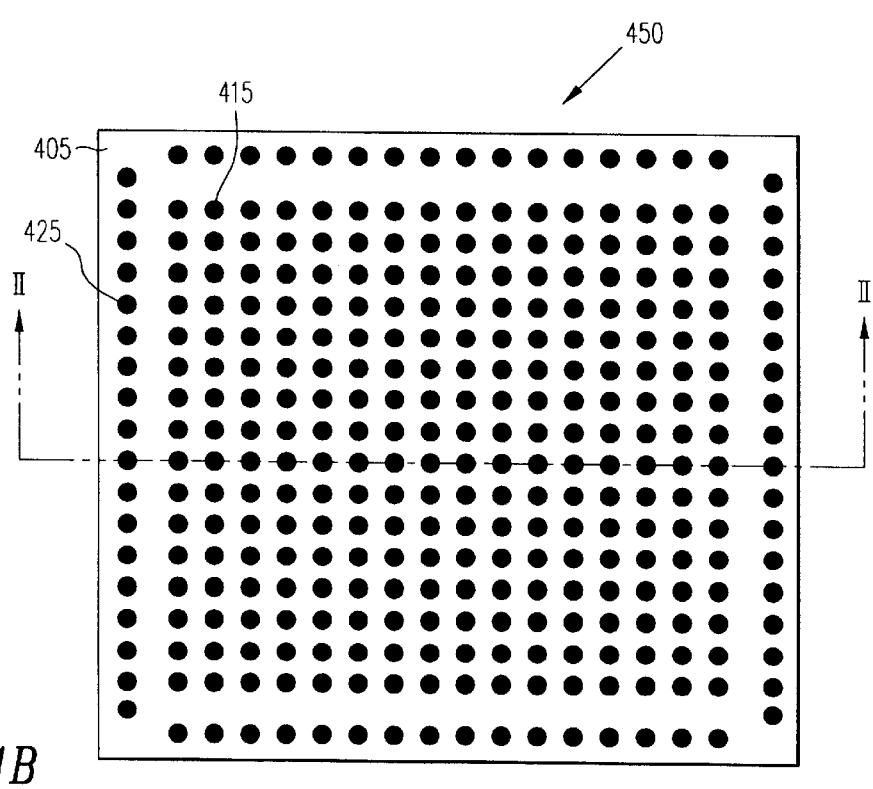
FIG. 4B is a plan view of a detector having a pattern of bumps that correspond to the bumps on the readout chip of FIG. 4A formed on a surface of the detector.

The readout chip 400 is to be mated to an IR detector die 450, illustrated in FIG. 4B. A surface 405 of the IR detector die 450 also has bumps 415, 425 formed thereon. Similar to the readout chip, the IR detector die 450 may be part of a larger IR detector material wafer, in which case the pattern of bumps 415, 425 are deposited on each IR detector die to be cut from the wafer. The bumps 415, 425 on the IR detector die 450 are all formed from In. Core bumps 415 are placed so as to mate with the core bumps 410 on surface 403 of the readout chip 400, and likewise the periphery bumps 425 are placed so as to mate with periphery bumps 420 on surface 403. Bumps are typically formed with a density of one bump per pixel, with each bump forming a unique electrical connection. In addition to the unique electrical connections, such IR sensor devices also have a common connection to all pixels in the detector. Therefore, the array will typically include additional bumps not used to form the unique electrical connection, e.g., the periphery bumps 420 or an outer ring of the core bumps 410, used to form the shared connection. Methods for forming In bumps onto a detector material are understood by those of skill in the art.

Figure 4C:
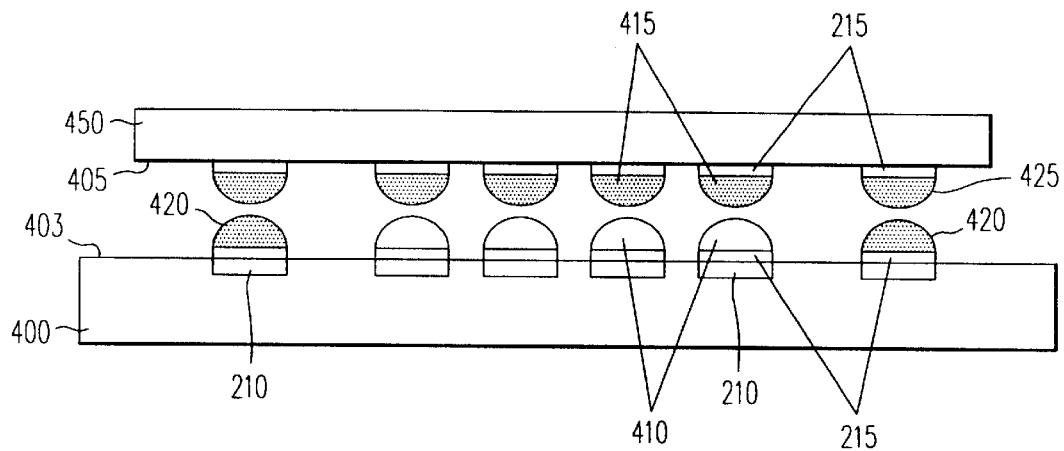
FIG. 4C is a cross-sectional view of the readout chip taken along line I—I of FIG. 4A and detector taken along line II—II of FIG. 4B, with bumps aligned.

The surfaces 403 and 405 are then aligned, so that the periphery bumps 420, 425 on each surface and the core bumps 410, 415 on each surface are in a position to contact each other, as illustrated in FIG. 4C. (In the sectional view of FIG. 4C, the number of core bumps shown in FIG. 4A has been reduced from 16 to 4 solely to simplify the illustration.)

FIG. 4C also illustrates the bond pads 210 formed on the readout chip 400 and the layered contact pads 215, which are formed on both the readout chip 400 and the detector 450. The readout chip 400 is typically composed of CMOS technology and thus contains aluminum bond pads 210 on the surface 403. The detector 450 may or may not contain bond pads 210, which may be formed on surface 405 from, e.g., aluminum, gold, or nickel. The metal contact layer 215 on surface 405 may be, for example, an approximately 200 Å thick titanium layer covered with an approximately 500 Å thick nickel layer.

Figure 5:
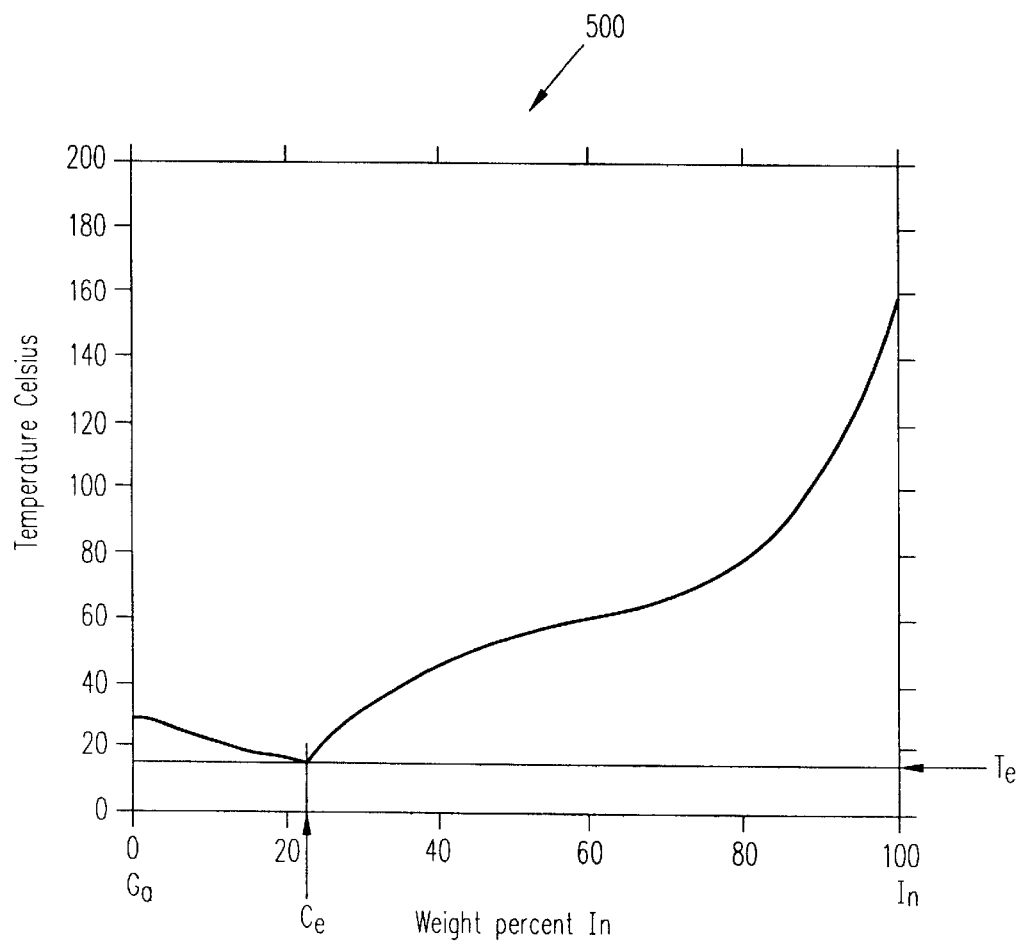
FIG. 5 is a binary phase diagram for the indium-gallium alloy.

The periphery bumps 420, 425 on each surface 403, 405 are all formed of In, and when contacted will form In interconnects structures as is understood by those of skill in the art and described in, e.g., U.S. Pat. No. 4,930,001 to Williams et al. and U.S. Pat. No. 5,186,379 to Helber et al., both incorporated herein by reference in their entirety. The core bumps 410 and 415, when brought together at a selected contact temperature, will form a Ga—In eutectic or hypoeutectic alloy, depending on the mass of the bumps 410, 415, as described above. The binary phase diagram 500 for Ga and In is illustrated in FIG. 5. The eutectic composition Ce occurs at approximately 25 weight % In. Thus, in one embodiment, each of the core bumps 410 (formed of Ga) has a mass that is three times the mass of each of the core bump 415 (formed of In). In general, the volume of the bumps 410, 415 is used when forming the bumps instead of mass (converted via density) because it is easier to measure. Using volume as a measure, the volume of each of the Ga core bumps 410 is 3.7 times the volume of each of the In core bumps 415.

FIG. 5 also shows the eutectic temperature, Te, for the Ga—In binary alloy is approximately 16° C. The melting point of Ga is approximately 30° C. and the melting point of In is approximately 157° C. The contact temperature, which is generally between the eutectic temperature Te and the melting temperature of the lowest melting component of the alloy, is thus in the range of 16° C. to 30° C. Typically, room temperature (approximately 25° C.) is used for the contact temperature.

Figure 6A:
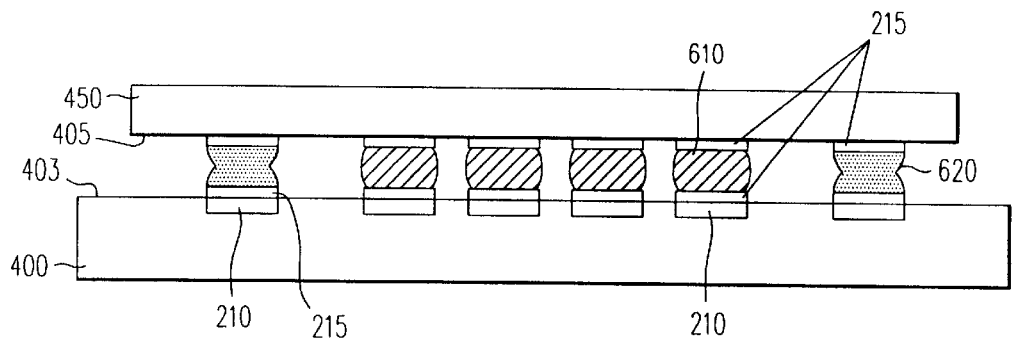
FIGS. 6A–6C are cross-sectional views of the readout chip and detector of FIG. 4C illustrating a method of forming interconnects.

Thus, when surfaces 403 and 405 are brought into contact at the contact temperature, as illustrated in FIG. 6A, the Ga core bumps 410 on surface 403 melt into In core bumps 415 on surface 405 to form joined bumps 610 of eutectic Ga—In alloy. The In periphery bumps 420 on surface 403 also bond with the In periphery bumps 425 on 20 surface 405 to form interconnects 620. The In—In interconnects 620 provide immediate structural support to the mated chip 400 and IR detector die 450, and prevent the chip 400 from collapsing onto the die 450 and squishing the Ga—In joined bumps. The use of Ga—In core and In—In periphery bumps also advantageously allows for operation of a self-leveling mechanism within the hybridization apparatus.

To form the In—In interconnects 620, it is generally necessary to apply some pressure to the mated chip 400 and IR detector die 450. The applied pressure is typically less than, for example, about 10 PSI (69 kPa), and is much less than would be necessary to bond arrays of the same size formed of only In—In bumps, which typically require pressures greater than 100 PSI (690 kPa). The inventors have found, for example, that using the In—In periphery 620 and In—Ga core 610 bumps in a 320×256 total bump array (with 30 μm pitch) allows a chip 400 and IR detector die 450 to be electrically and physically connected using only a one lb. load (approximately 45 kPa). In the resulting detector, essentially 100% of the electrical interconnects between chip 400 and die 450 were formed, i.e., less that 0.01% of the 81,920 pixels were not electrically connected when the detector was operated. Using conventional In—In only interconnects, at least a 30 lb. load would be required to successfully form such connections.

Figure 6B:
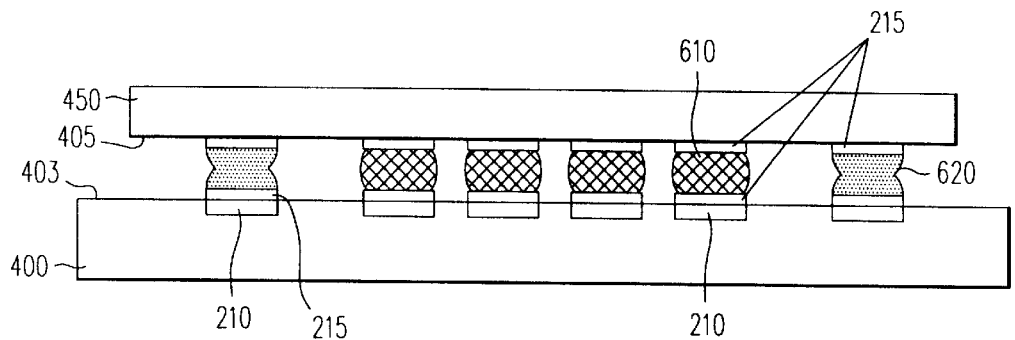
Figure 6C:
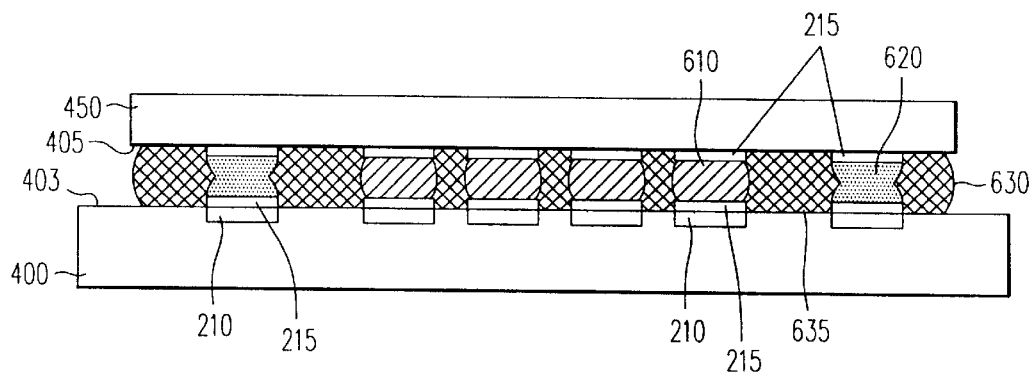

The mated readout chip 400 and detector die 450 may then be cooled to below the eutectic temperature, which in the case of Ga—In is 16° C., to solidify the joined core bumps 610, as illustrated in FIG. 6B. Alternatively, because eutectic temperature of the Ga—In alloy is near room temperature, it may be desirable keep the temperature above the eutectic temperature, particularly if the device formed from chip 400 and detector die 450 is to be operated at, or near, room temperature. In this case, an epoxy or other adhesive material 630, for example, Bondline 7247 or 6460 (Bondline Electronic Adhesives, San Jose, Calif.), can be wicked into the interstices 635 to provide additional structural support.

Although Ga is used in this example, any metal that forms a eutectic alloy with In can be used for bumps 410 if bumps 415 are formed of In. Alternatively, core bumps 410 and 415 can be formed from any two or more materials that form a eutectic composition. Any pattern of bumps that results in the desired mechanical strength between the mated chip 400 and IR die 450 without requiring excessive pressure to form the interconnects may be used. For example, to attain the necessary structural support, it may be necessary to add additional rows of In—In bumps, at the periphery or otherwise. In—In bumps can be added to the array of interconnects until the point where it is necessary to use more force to join substrates 400 and 450 than the substrates 400, 450 can receive without being damaged.

A method for forming an array of bumps of more than one material is illustrated in FIGS. 7A to 7F for the case of the integrated circuit readout chip as illustrated in FIG. 4A. This method is applicable to any substrate in which more than one material is to be used in an array of bumps.

Figure 7A:
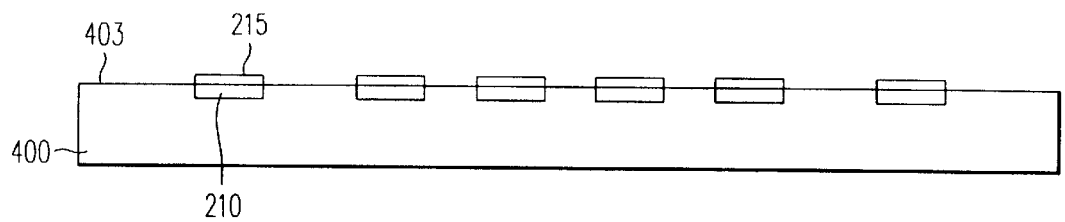
FIGS. 7A–7F illustrate a process sequence for forming an array of core bumps and periphery bumps on a substrate.
Figure 7B:
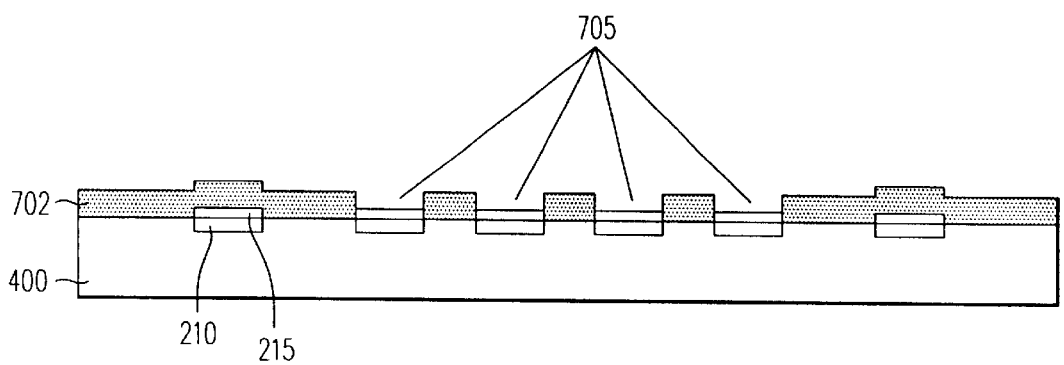
Figure 7C:
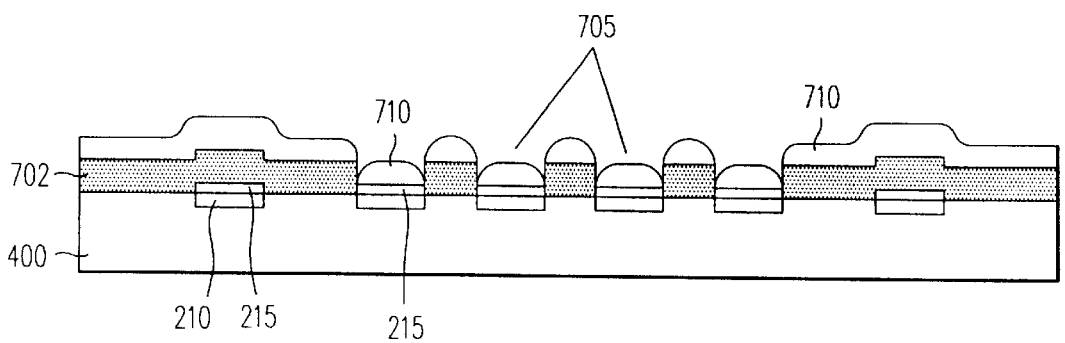

FIG. 7A illustrates the readout chip 400 having bond pads 210 and contact metal layer 215 formed thereon. The contact metal layer 215 is formed using patterned mask and deposition methods known to those of skill in the art. Surface 403 is then coated with a resist 702 and patterned, as illustrated in FIG. 7B, to produce openings 705 within the resist 702 into which core bumps 410 will be deposited. A mask aligner such as Cannon 501F Proximity Mask Aligner or a Karl Suss MA6 (Karl Suss America, Inc., Waterbury Center, Vt.) may be used when patterning the resist 702. The size of the openings 705 is used to control the size of the bumps 420 and is typically in the range of 5×5 µm to 15×15 µm, for example, 10×10 µm.

The core bump material 710 is then deposited onto the exposed metal layers 215 through openings 705 and also onto resist 702. For a given area of opening 705, the volume of the resulting bump is controlled by the thickness (or height) of the material deposited onto metal layer 215. The thickness is measured using methods known to those of skill in the art. These methods include, for example, using an in situ thickness monitor on the deposition equipment to estimate the thickness during deposition, or, more directly, by using a witness wafer in the process which is then probed, for example, by a Dektak Stylus Profiler (Sloan Technology Corporation, Santa Barbara, Calif.), to determine the height of the bumps. The method of deposition depends on the core bump material. In one embodiment, core bump material 710 is Ga, which is typically deposited by evaporation.

Figure 7D:
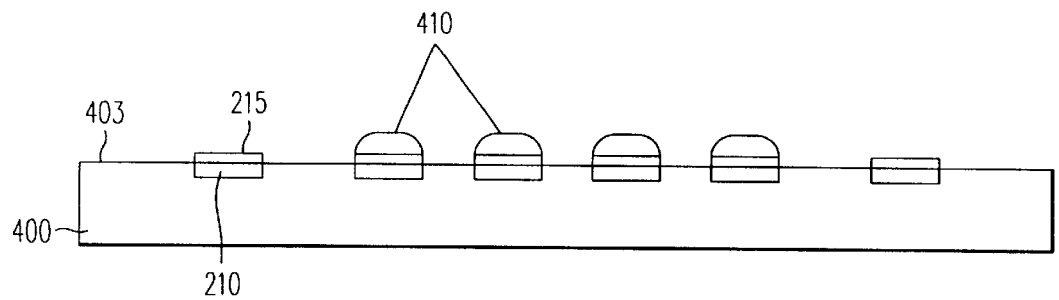
Figure 7E:
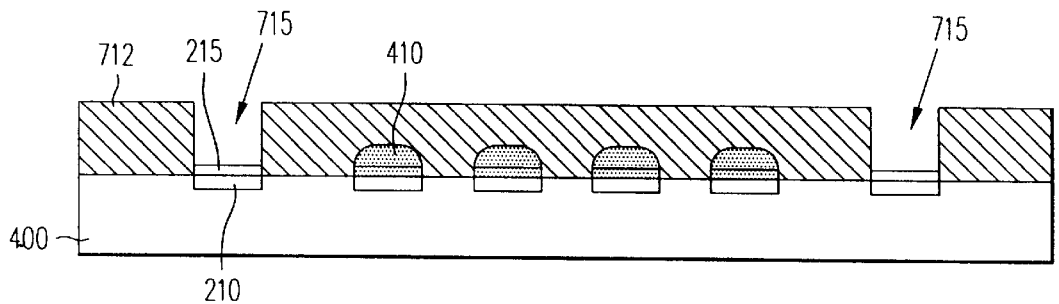
Figure 7F:
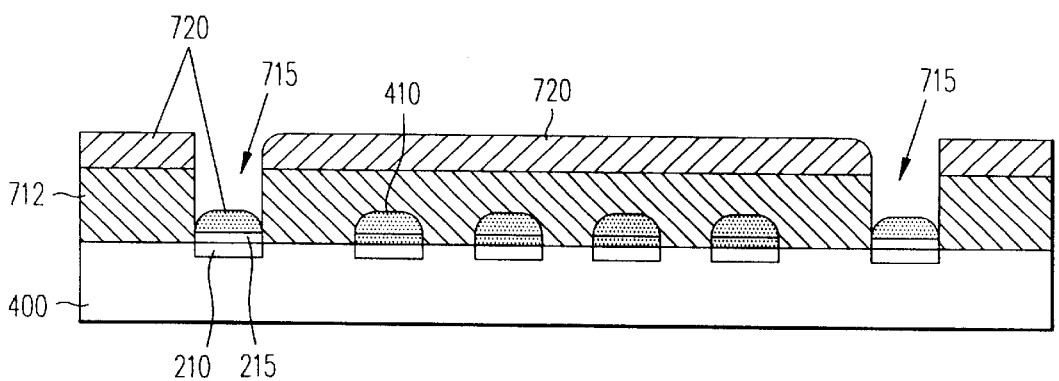

The photoresist 702 is then removed using a standard lift-off process, leaving the core bumps 410, as illustrated in FIG. 7D. A second resist 712 is coated onto surface 403 over core bumps 410 and patterned to leave openings 715 into which the periphery bump material will be deposited. Periphery bump material 720 is then deposited over the resist 712 and onto the metal layer 215 through the openings 715, as illustrated in FIG. 7F. The periphery bump material is typically indium, which is also deposited by evaporation. Removal (lift-off) of the photoresist 715 results in the structure illustrated in FIGS. 4A and 4C.

The embodiments described above are intended to be illustrative only, and not limiting. Many variations and modifications in accordance with the invention will be evident to those of skill in the art. Therefore, the appended claims are to encompass all such changes and modifications as falling within the scope of this invention.

What is claimed is:

1. A method of forming electrical interconnects comprising:
    forming a plurality of first bumps of a first material having a first melting temperature on a first substrate;
    forming a plurality of second bumps of a second material having a second melting temperature on a second substrate, wherein said first material and said second material form a composition having a eutectic temperature;
    forming a plurality of third bumps of a third material on said first substrate, wherein the third material is different than the first material;
    forming a plurality of fourth bumps of a fourth material on said second substrate;
    aligning said first and second plurality of bumps; and
    contacting said first and second plurality of bumps at a contact temperature above the eutectic temperature and below the lowest of the first and second melting temperatures, said first and second plurality of bumps forming a plurality of first joined bumps that electrically interconnect said first and second substrates, and wherein aligning said first and second plurality of bumps aligns said third and fourth plurality of bumps and contacting said first and second set of bumps causes contact between said third and fourth plurality of bumps, said third and fourth plurality of bumps forming a plurality of second joined bumps to provide structural support and an electrical connection between said first and second substrates.

2. The method of claim 1, wherein said first material is gallium and said second, third, and fourth material are indium.

3. The method of claim 1, wherein said plurality of second joined bumps form a shared common electrical connection between said first and second substrates.

4. The method of claim 1, wherein each of said first bumps has a first volume, each of said second bumps has a second volume, and a ratio of said first volume to said second volume results in said first joined bumps having substantially a eutectic composition.

5. The method of claim 1, wherein each of said first bumps has a first volume, each of said second bumps has a second volume, and a ratio of said first volume to said second volume results in first joined bumps having a mostly solid phase at said contact temperature.

6. The method of claim 1, wherein said first joined bumps form a hypoeutectic alloy.

7. The method of claim 1, wherein said first joined bumps form a ternary eutectic alloy.

8. The method of claim 1, wherein said first substrate is InSb, HgCdTe, CdTe, or InGaAs and said second substrate is an integrated circuit readout chip.

9. The method of claim 1, further comprising applying a pressure of less than about 10 PSI to said first and second substrate after contacting said first and second plurality of bumps.

10. An infrared sensor device formed at least in part by the method of claim 1.

11. The method of claim 1, wherein said plurality of third bumps form a periphery around said plurality of first bumps and said plurality of fourth bumps form a periphery around said plurality of second bumps.

12. The method of claim 1, further comprising cooling said first joined bumps and said second joined bumps to a temperature below said eutectic temperature.

13. The method of claim 1, further comprising applying an adhesive material to interstices between said first joined bumps and said second joined bumps.

14. A method of forming electrical interconnects comprising:
    forming an array of first bumps and an array of second bumps on a first substrate, wherein said first bumps comprise a first material and said second bumps comprise a second material which is different than the first material;
    forming an array of third bumps and an array of fourth bumps on a second substrate, said array of third bumps corresponding to said array of first bumps and comprising a third material, wherein said first material and said third material form a eutectic composition having a eutectic temperature;
    aligning said array of first bumps with said array of third bumps and said array of second bumps with said array of fourth bumps;

contacting said array of first bumps with said array of third bumps at a contact temperature above the eutectic temperature, said array of first and third bumps forming a plurality of joined bumps that electrically interconnect said first and second substrates; and contacting said second bumps with said fourth bumps to provide structural support between said first substrate and said second substrate and provide a common electrical connection.

15. The method of claim 14, wherein said second bumps form a periphery around said first bumps.

16. The method of claim 14, wherein said second material and said third material is indium and wherein said first material is gallium.

17. The method of claim 14, wherein said array of first bumps and said array of third bumps form a hypoeutectic alloy or a ternary eutectic alloy.

18. A method of forming electrical interconnects comprising:

forming a plurality of first bumps of a first material having a first melting temperature on a first substrate;

forming a plurality of second bumps of a second material having a second melting temperature on a second substrate, wherein said first material and said second material form a composition having a eutectic temperature and each of said first bumps has a first volume and each of said second bumps has a second volume;

forming a plurality of third bumps of a third material on said first substrate, wherein said third material is different than the first material;

forming a plurality of fourth bumps of a fourth material on said second substrate;

aligning said first and second plurality of bumps; and contacting said first and second plurality of bumps at a contact temperature above the eutectic temperature and below the lowest of the first and second melting temperatures to form a plurality of first joined bumps that electrically interconnect said first and second substrates, wherein a ratio of said first volume to said second volume results in first joined bumps having a mostly solid phase at said contact temperature and aligning said first and second plurality of bumps aligns said third and fourth plurality of bumps and contacting said first and second set of bumps causes contact between said third and fourth plurality of bumps to form a plurality of second joined bumps which electrically interconnects said first and second substrates.

19. The method of claim 18, wherein the ratio of said first volume to said second volume is predetermined to control a phase of the first joined bumps.

20. The method of claim 18, wherein the plurality of first bumps further comprises a third material, wherein said first material, said second material, and said third material form a ternary eutectic alloy.

21. An infrared sensor device formed at least in part by the method of claim 18.

22. The method of claim 18, wherein said plurality of first joined bumps forms a hypoeutectic alloy.

23. The method of claim 18, wherein said plurality of second joined bumps provides structural support between said first and second substrates.

24. The method of claim 23, wherein said plurality of second joined bumps form a shared common electrical connection between said first and second substrates.

25. The method of claim 18, wherein comprising cooling said first joined bumps and said second joined bumps to a temperature below said eutectic temperature.

26. The method of claim 18, further comprising applying an adhesive material to interstices between said first joined bumps and said second joined bumps.

27. The method of claim 18, wherein said second material, said third material, and said fourth material are indium and said first material is gallium.

28. An infrared sensor device formed at least in part by the method of claim 26.

* * * * *